United States Patent Office 3,567,443

Patented Mar. 2, 1971

3,567,443

DIFFUSION TRANSFER PRODUCTION OF PRINTING PLATES WITH LiOH AS ALKALIZING AGENT

Louis Maria De Haes, Edegem, Belgium, assignor to Gevaert Photo-Producten N.V., Mortsel, Belgium No Drawing. Continuation-in-part of application Ser. No. 296,096, July 18, 1963. This application Aug. 15, 1967, Ser. No. 660,591

Claims priority, application Belgium, July 18, 1962, 41,833

Int. Cl. G03c 5/54

U.S. Cl. 96—29 2 Claims

ABSTRACT OF THE DISCLOSURE

In the production of planographic printing plates by means of the silver complex diffusion transfer process, an increased number of such printing plates can be produced with the otherwise convention diffusion transfer processing liquid by employing as the alkaline component of that liquid lithium hydroxide in a concentration of about one-half to one mol per liter. The printing plate is formed of metal participating in the chemical reduction of complexed silver halide which diffuses during the diffusion transfer process, and aluminum sheets are preferred.

This invention relates to the manufacture of printing plates, the principles of which have been described in the British patent specifications 913,591 and 946,538.

The present application is a continuation-in-part application of U.S. patent application Ser. No. 296,096, now abandoned.

A planographic printing plate obtained according to the method the principles of which have been described in the British specifications above referred to, comprises a metal layer onto which a silver-containing image is present, formed thereon by using the metal layer as an image-receiving layer in a silver complex diffusion transfer process. The used metal is such that it takes an active part in the reduction process of the diffusing complexed silver halide. The processing liquid used in this process not only provides for the development of the image-wise exposed light-sensitive material and for the image formation by diffusion transfer on the metal layer. Thanks to its rather strong alkalinity it is capable, moreover, of eliminating the thin oxide layer from the metal layer before its use, so as to render it accessible to the reduction process of the complexed silver salts diffusing to it.

As most essential constituents, the known processing liquids contain developing substances, a complexing agent for silver halide, and an alkali. As alkali, sodium hydroxide or potassium hydroxide is practically always used, mostly in a concentration of about molar/4.

It has been experienced, however, that such a processing liquid containing sodium hydroxide or potassium hydroxide in a concentration of about molar/4 is little stable. It loses rather quickly its alkalinity by the action of the carbon dioxide of the air on said sodium hydroxide or potassium hydroxide, which results in the production of sodium carbonate or potassium carbonate that are too weakly alkaline substances for carrying through the process for the manufacturing of printing plates. After a relatively short period, the processing liquid thereby becomes useless for the elimination of the thin oxide layer from the metal layer and for carrying out the diffusion transfer image formation. As a result, this liquid can only be used for the production of a limited number of printing plates, and moreover, the processing time in the bath and the contact time of the light-sensitive and image-receiving materials after the bath treatment have to be adjusted often.

It has been tried to overcome these difficulties and to obtain a processing liquid which can be used for a longer time, by enhancing the concentration of the sodium hydroxide or potassium hydroxide to molar/2 and even to ¾ molar. This measure, however, involves too strong an attack of the metal layer serving as image-receiving layer and the hydrogen set free thereby forces back the diffusing complexed silver salts; besides the poor and incomplete silver image occasionally produced is strongly etched by the highly alkaline processing liquid. After treatment of a large quantity of material with such a strongly alkaline processing liquid or after exposure of the latter to the air for a large time, in which two cases the alkalinity of the processing liquid is found to be reduced considerably, it is sometimes possible indeed to produce some usable printing plates, though not many.

It is an object of the present invention to produce a larger quantity of printing plates with the aid of a well established amount of alkaline processing liquid.

It is a further object of the present invention to produce said larger quantity of printing plates in such a manner that already the first plate produced is of a good quality. An even further object of the present invention is to provide a processing liquid having a prolonged durability, in other words a processing liquid by which a larger quantity of printing plates can be produced.

Another object of the present invention is to provide a processing liquid with better stability characteristics, so that a same processing time can be held on for producing a large number of printing plates.

These and even further objects are accomplished according to the present invention by making use in the process of manufacturing printing plates according to the method, the principles of which have been described in the British patent specifications 913,591 and 946,538, in the alkaline processing liquid for carrying out the silver complex diffusion transfer process, of lithium hydroxide as the essential alkalizing agent, in a concentration ranging from 13 to 25 g. per liter of processing liquid, which corresponds approximately with a concentration of M/2 to M.

By proceeding in this way, the objects clearly set out above may be accomplished.

The use of lithium hydroxide in such high concentrations has no disadvantages. It can be incorporated easily in large concentrations into the processing liquid. Lithium hydroxide does not counteract the formation of the diffusion transfer image and does not etch too strongly the metal plate or the silver image produced thereon.

It is sufficiently clear that the process according to the present invention is an improvement of the process according to the British patent specifications cited above. For more particulars on this process, not directly concerning the improvement involved in the present application, reference may be made to the said patent specifications in conjunction with which the present invention has to be read.

In carrying out the method of the present invention, the metal layer, whereon the silver image will be produced, can be vacuum-deposited on a flexible support. More particulars on this embodiment can be found in the British patent specification 1,031,297.

The printing parts of the plate manufactured according to the present invention can be strengthened to withstand mechanical damage, by applying a suitable lacquer thereto. In this respect reference can be made to the British patent specifications 968,706 and 1,071,163.

Finally, it is also possible to reverse the image values of the printing plate. A suitable method for accomplishing this embodiment has been described in the U.S. patent specification 3,260,198.

The following specific examples illustrate the process for producing printing plates according to the present invention, without, however, limiting same in some respect.

EXAMPLE 1

To a silver chloride emulsion ready for coating, was added $CdCl_2 \cdot 2H_2O$ in such a manner and in such an amount that, after coating, the emulsion layer contained per sq. m. 1.43 g. of silver and 0.51 g. of cadmium. The emulsion was coated on a baryta-coated paper base and the light-sensitive paper thus obtained was image-wise exposed. The exposed negative and an aluminum sheet consisting of 99.5% of aluminum and 0.5% of magnesium and silicon, and the surface of which was brushed to grain depths of 2 to 4 microns, were passed through a common apparatus for carrying out the diffusion transfer process. This apparatus contained an aqueous developer solution of the following composition:

Water—800 cm.$^3$
Trisodium salt of ethylenediamine tetraacetic acid—2 g.
Sodium sulfite (anhydrous)—120 g.
Sodium thiosulfate (anhydrous)—4.25 g.
Potassium bromide—1 g.
Hydroquinone—10 g.
1-phenyl-3-pyrazolidone—2 g.
Lithium hydroxide—16 g.
Isopropanol—100 cm.$^3$
Water to 1000 cm.$^3$.

After passing through this solution, the negative and the aluminum plate were brought into contact between rubber rollers. The paper sheet carrying the emulsion layer was separated from the aluminum sheet, leaving a silver image on the aluminum sheet firmly adhering to the surface of said sheet. Immediately thereafter, the plate bearing the image was further rubbed for about 30 seconds with a cloth, soaked with a lithographic preparation of the following composition:

| | G. |
|---|---|
| Carboxymethylcellulose | 3.24 |
| Sodium phosphate | 0.6 |
| Phosphoric acid | 0.3 |
| Cetyltrimethylammonium bromide | 0.006 |
| Aqueous solution of formaldehyde (20%) | 1 |
| Water to 100 cm.$^3$. | |

The lithographic printing plate thus obtained was ready for use.

EXAMPLE 2

A photographic light-sensitive silver chloride sheet material comprising a layer of a starch ether on top of the silver halide emulsion layer was image-wise exposed and was then together withan aluminum plate of about the same size (1/3 of a sheet maximum 25.4–39 cm.) at a rate of 3 cm./sec. conducted through an apparatus as commonly used for the production of images according to the silver complex diffusion transfer process, said apparatus containing 150 ccs. at 20° C. of the following developing liquid:

Water—800 ccs.
Sodium sulphite—90 g.
Potassium bromide (anh.)—0.75 g.
Ethylene diamine tetraacetic acid trisodium salt—1.75 g.
Sodium thiosulphate (anh.)—3.5 g.
Sodium hydroxide—11.5 g. (±molar/4).
Hydroquinone—10 g.
Ethanol—30 ccs.
1-phenyl-3-pyrazolidone—1.5 g.
Carboxymethylcellulose—10 g.
Water to 1 liter.

The light-sensitive material and the aluminum plate were then pressed against each other and after an optimal contact time again separated from each other.

The plate showing the diffusion transfer silver image produced thereon could be subjected to a usual treatment with a lithographic preparation for improving the hydrophilic properties of the non-printing areas and the hydrophobic properties of the printing areas. Finally the plate could be treated with a usual lithographic lacquer composition containing a purple dye. The first plate produced had favorable printing characteristics.

Each time when using a light-sensitive material and an aluminum plate of the same type and size as used for the preparation of the first plate described above and while working in the same conditions with the same already used developing liquid, further printing plates were obtained. In this way between 30 and 40 usable printing plates could be produced.

By proceeding in an identical manner as described above, with the exception however, that in the developing liquid 30 g. of sodium hydroxide was incorporated (±3/4 molar) instead of 11.5 (±1/4 molar). Usable printing plates could be obtained only from the 20th printing plate till somewhere between the 40th and the 50th plate produced.

Finally, by proceeding again in an identical manner as described above, but with the only difference that in the developing liquid sodium hydroxide was replaced by lithium hydroxide in an amount of 18 g. per liter (±3/4 molar) the first plate produced was already usable and between 40 and 50 usable printing plates could be produced.

I claim:

1. In a process for the manufacture of a silver image bearing metal plate for printing purposes by application of the silver halide diffusion transfer process, the steps of image-wise exposing a photographic material comprising a light-sensitive silver halide emulsion layer, treating the photographic material and a metal plate, which is capable of taking part in the reduction of the diffusing complexed silver halide, in the presence of a developing substance and a complexing agent for silver halide with a processing liquid containing per liter from 13 to 25 g. of lithium hydroxide as the essential alkalizing agent in said liquid, bringing the photographic material in contact with the metal plate for a period of time sufficient for the complexed silver halide to diffuse from said emulsion layer for reduction and deposition as silver metal on said plate, and separating them from each other.

2. The process of claim 1 wherein said metal plate consists essentially of aluminum.

References Cited

UNITED STATES PATENTS

| | | | |
|---|---|---|---|
| 3,087,817 | 4/1963 | Rogers | 96—29 |
| 3,379,528 | 4/1968 | Henn et al. | 96—28 |

FOREIGN PATENTS

| | | | |
|---|---|---|---|
| 946,538 | 1/1964 | Great Britain | 96—29 |

J. TRAVIS BROWN, Primary Examiner

W. H. LOUIE, Jr., Assistant Examiner

U.S. Cl. X.R.

96—33